United States Patent [19]

Kitamura et al.

[11] Patent Number: 5,614,735
[45] Date of Patent: Mar. 25, 1997

[54] SEMICONDUCTOR LASER DEVICE

[75] Inventors: Shoji Kitamura; Satoru Nagano; Yoichi Shindo; Katsumi Oguri, all of Kawasaki, Japan

[73] Assignee: Fuji Electric Co., Ltd., Kanagawa, Japan

[21] Appl. No.: 463,070

[22] Filed: Jun. 5, 1995

[30] Foreign Application Priority Data

Jun. 7, 1994 [JP] Japan ..................................... 6-124815

[51] Int. Cl.⁶ ............................. H01C 33/00; H01C 23/28
[52] U.S. Cl. ........................... 257/99; 257/100; 257/796; 372/36; 372/98; 362/368; 362/373
[58] Field of Search ........................ 257/99, 100, 796; 372/36, 98; 362/368, 373

[56] References Cited

U.S. PATENT DOCUMENTS

| 4,157,486 | 6/1979 | Fegley | 257/100 |
|---|---|---|---|
| 5,266,817 | 11/1993 | Lin | 257/99 |
| 5,270,555 | 12/1993 | Ito et al. | 257/99 |
| 5,355,385 | 10/1994 | Amane et al. | 372/49 |
| 5,384,471 | 1/1995 | Schairer et al. | 257/99 |
| 5,444,726 | 8/1995 | Kitamura et al. | 372/36 |

FOREIGN PATENT DOCUMENTS

| 484887 | 5/1992 | European Pat. Off. . |
|---|---|---|
| 568830 | 11/1993 | European Pat. Off. . |
| 2125687 | 5/1990 | Japan . |
| 2284934 | 6/1995 | United Kingdom . |

*Primary Examiner*—Sara W. Crane
*Assistant Examiner*—David Ostrowski
*Attorney, Agent, or Firm*—Spencer & Frank

[57] ABSTRACT

A lead frame 32 has projecting portions 36, 37 projecting in a right-and-left direction, like arms, from the sides of its broad end portion 32a. The projecting piece portions 36, 37 include mold region parts 36a, 37a that are molded within a flat type sealing resin member 35, and exposed piece portions 36b, 37b that are exposed to the outside from the sealing resin member 35. One of the exposed parts, 36b, has an arcuate segment 36c inscribed in a hypothetical circle drawn with radius R about the point of light emission, C, on an LD chip 1. The other exposed part 37b has an arcuate segment 37c inscribed in the hypothetical circle drawn with radius R. A semiconductor laser device having these arcuate segments can be fitted into a stepped accommodating hole of an instrument and set in place there, just as can a can type semiconductor laser device. The point of light emission, C, on the LD chip 1 is also fixed. Thus, neither a shift in the point of light emission, C, nor the peeling of resin arises. Moreover, an annular mounting aid 48 inscribed in the hypothetical circle drawn with radius R can be attached, instead of the arcuate segments 36c, 37c, to the exposed parts 36b, 37b, whereby the same effects can be obtained.

20 Claims, 12 Drawing Sheets

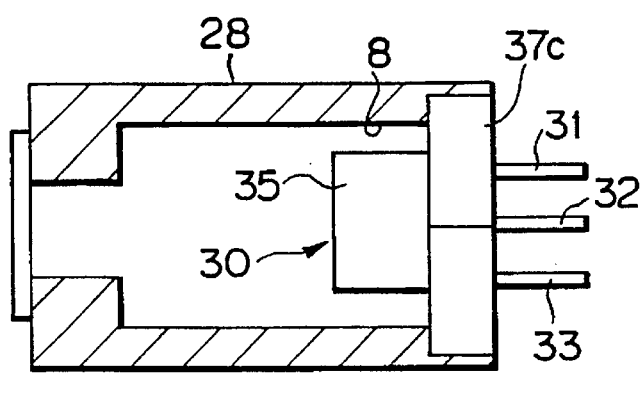
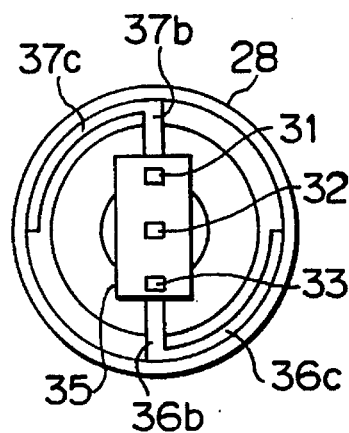
FIG. 18  FIG. 19
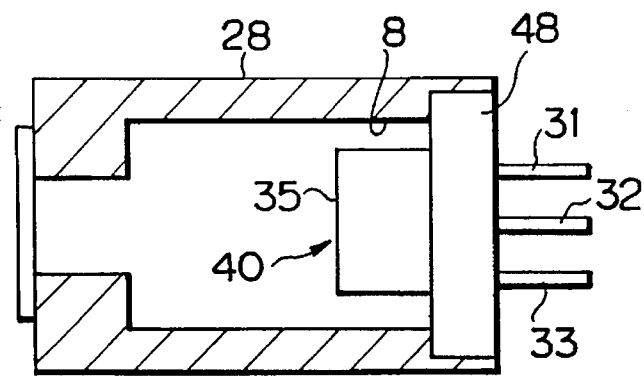
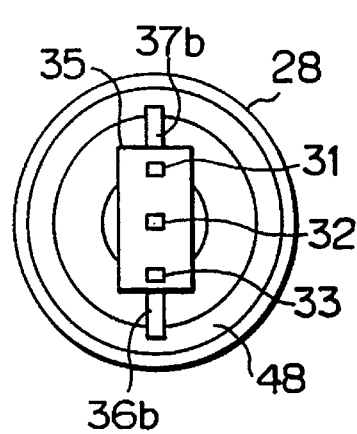
FIG. 20  FIG. 21
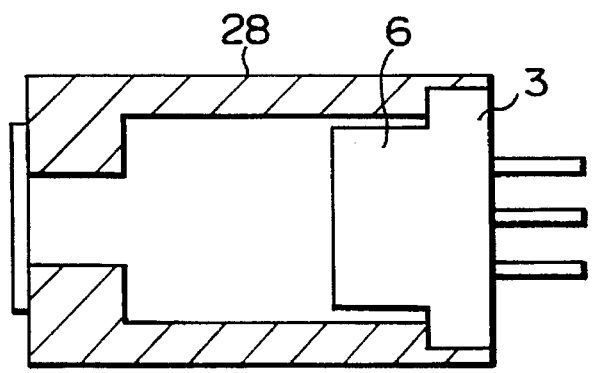
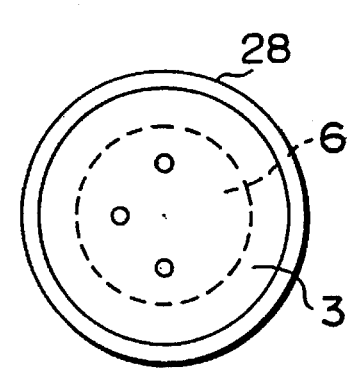
FIG. 22 (PRIOR ART)  FIG. 23 (PRIOR ART)

1

SEMICONDUCTOR LASER DEVICE

BACKGROUND OF THE INVENTION

1. Field of the Invention

The present invention relates to a semiconductor laser device of the resin mold package type accommodating a laser diode (hereinafter referred to as an LD) element.

2. Description of the Prior Art

Semiconductor laser devices such as LD elements are used in optical disc devices which accommodate compact discs (hereinafter referred to as CDs), or various instruments using light, such as laser beam printers. Can packages are known as examples of the semiconductor laser devices. FIG. 1 is a perspective view, partly broken away, of a can type semiconductor laser device. FIG. 2 is a partially sectional view showing an embodiment in which this can type semiconductor laser device is mounted on an instrument. The can type semiconductor laser device has a square rod-shaped heat dissipater 4 protruding upwards from the top of a disc-shaped stem 3, a submount layer 2 also serving as a radiating board, an LD element comprising an LD chip 1 provided on the submount layer 2, and a cap 6 with a glass window 5 at the top. The semiconductor laser device is of a structure in which the LD element is soldered to a side surface (main surface) of the heat dissipater 4, and the cap 6 is welded to a collar portion 3a of the stem 3 to cover and protect the parts upwardly protruding from the stem 3. On the collar portion 3a is formed a register groove 3b for use in packaging. The numeral 12' denotes a lead terminal. As shown in FIG. 2, this can type semiconductor laser device is set in place in an instrument by placing the cap 6 side of the device in a stepped accommodating hole (grooved portion) 8 formed in part of the instrument, indicated at 7, and adhesive bonding or contact bonding is used for mounting the collar portion 3a of the stem 3 at the step portion. Laser light 9 is projected in the direction of an arrow through the glass window. With this can type of semiconductor laser device, the point of emitting laser light needs to be kept at a fixed position. As shown in FIGS. 3 and 4, therefore, the LD chip 1 is adjusted to be positioned at the intersection 10 of a plane passing the centers of the circular stem 3 and the glass window 5 (both being concentric members) and perpendicular to the main surface of the heat dissipater 4 (X-axis plane) and a plane passing the centers of the circular stem 3 and the glass window 5 and perpendicular to the former plane (Y-axis plane), as viewed from above in a plan view, with the locations of the submount layer 2 and the heat dissipater 4 being determined relative to the position of the LD chip 1. When the device is to be incorporated in the instrument, the outer periphery and top surface of the collar portion 3a of the stem 3 are mounted on the groove portion 8, as shown in FIG. 2, and then adhesive bonded or contact bonded to fix the device. The shape of the semiconductor laser device with the collar portion 3a complies in practice with certain standards, since changes in the design or parts of the instrument have to be avoided. The outside diameter of the collar portion 3a of the stem 3 is 5.6 mm in the currently most mass-produced semiconductor laser devices for CDs with a low output of 3 to 5 mW, and 9 mm in other, high output, semiconductor laser devices.

Low cost semiconductor laser devices are in high demand. In recent years, resin mold type semiconductor laser devices have been developed which are lower in the cost of manufacturing and higher in the degree of freedom of shape than the can type semiconductor laser devices. FIG. 5 is a perspective view showing the shape of a resin mold type semiconductor laser device. This resin mold type semiconductor laser device has an LD chip 1 mounted on the top of a broad end portion of a lead frame 12 via a submount layer 2, and the surroundings of the front end of the lead frame, including the LD chip 1, are molded with a sealing resin member (resin mold) 11 such as a transparent epoxy resin. The sealing resin member 11 takes a cylindrical shape having a collar portion 11a corresponding to the collar portion 3a of the can type device stem 3. The numeral 13 signifies a gold wire. The resin mold type semiconductor laser device has been known as a light emitting device with a low optical density per unit area, such as an LED. Such a resin mold type semiconductor laser device having the collar portion 11a is easily mounted on an instrument by the same procedure used for the can type semiconductor laser device, and also has the advantage of low manufacturing costs because it is of a mold type.

FIG. 6 is a schematic sectional view showing the structure of the LD chip 1 used in the above mold type semiconductor laser device. The LD chip 1 has a double heterostructure (DH), which comprises an n type clad layer 15 of AlGaAs, an active layer 16 of GaAs, a p type clad layer 17, and a p type cap layer 18 laminated in this order on an n type GaAs substrate, and further has an electrode 19 on the surface side of the closed end of the p type cap layer, as well as a back electrode 20 on the rear side of the GaAs substrate 14. FIG. 7 is a sectional view taken on line A—A of the LD chip 1 shown in FIG. 6, with the same numerals being used on the portions common to both drawings. In the LD chip 1, an end face destruction preventing layer (passivation film) 22, such as silicone, with a low absorption coefficient for light in the wavelength band of laser light 9 and high thermal stability, is formed on a light emitting end face 21 which projects laser light 9. This layout makes it possible to prevent the characteristics of the sealing resin member 11, which seals the LD chip 1, from deteriorating due to optical damage. In other words, when the end face destruction preventing layer 22 resistant to laser light 9 is inserted between the light emitting end face 21 and the sealing resin member 11, the optical density of laser light 9 at the sealing resin member 11 is reduced, whereby possible damage to the sealing resin member 11, such as epoxy resin, by laser light 9 is prevented.

FIG. 8 is a plan view of the resin mold type semiconductor laser device shown in FIG. 5. FIG. 9 is a sectional view taken on line A—A of FIG. 8. The LD chip 1 in the resin mold type semiconductor laser device is positioned at the intersection 10 of the X axis and the Y axis which is at the center of the sealing resin member 11, as in the case of the can type device. Thus, the central point 23 in the thickness direction of the broad portion of the lead frame 12 bearing the LD chip 1 is away from the position of the LD chip 1 (the center of the sealing resin member 11) in the −X direction by the sum of the thickness of the submount layer 2 and a half of the thickness of the lead frame 12 (offset distance $\Delta X_{off}$).

However, the following two major problems occur with a semiconductor laser device of the above-described structure:

(1) The position of the point of light emission varies according to temperature rises of the resin around the LD chip 1 due to a current flowing there, or changes in environmental temperature.

(2) Peeling occurs between the sealing resin member 11 and the end face destruction preventing layer 22, causing the optical radiation characteristics to deteriorate. The optical radiation characteristics are concretely expressed as a farsighted visual field pattern or far field pattern (which may be hereinafter referred to as FFP).

FIG. 10 is a graph showing the relationship between the amount of the X-direction displacement of the point of light emission and the time that elapses until the action of turning light on or off. In the drawing, a dotted line represents the data for the cylindrical resin mold type semiconductor laser device illustrated in FIGS. 8 and 9, and a solid line represents the data for a flat resin mold type semiconductor laser device to be described later. According to FIG. 10, when the cylindrical resin mold type semiconductor laser device illustrated in FIGS. 8 and 9 was activated with an operating current of 50 mA at room temperature, a marked movement in the X direction of the point of light emission was observed. As seen from FIG. 10, after the laser was turned on, the point of light emission was displaced by 0.5 μm in the −X direction (in the X-axis direction, the LD chip 1 side is designated as +X, and the lead frame 12 side as −X), i.e., on the lead frame 12 side, in about 2 minutes; whereas after the laser was turned off, the point of light emission returned in about 2 minutes to the center (intersection) 10, which had been the point of light emission before turning on the light. When this semiconductor laser device was integrated into an optical pickup for CDs, the action of the CD device became disorderly immediately after the semiconductor laser device was lit up, or at the time of changes in environmental temperature. The shift in the position of the point of light emission was found to come from the positional movement in the −X direction of the lead frame 12 by thermal expansion of the sealing resin material associated with heat generation during the operation of the LD chip 1, or with changes in environmental temperature. The essential cause of this positional movement is that, as shown in FIGS. 8 and 9, the lead frame 12 having the LD chip 1 mounted thereon has an offset ($\Delta X_{off}$) 24 from the center of the sealing resin member 11.

One of the methods for inhibiting the displacement of the point of light emission is to expose part 12a of a lead frame 12, which bears an LD chip 1, from a sealing resin member 11 to the outside, and fix the exposed portion, as shown in FIG. 11. According to this method, the exposed part 12a of the lead frame 12 is immobile even when the resin material thermally expands. Hence, the LD chip 1 borne thereon also undergoes little dislocation, thus making it possible to prevent the position of the point of light emission from moving. The aforementioned problem of resin peeling (2) is subordinate to the problem (1) and can be practically solved by molding the sealing resin member 11 into a thin flat plate, as illustrated in FIG. 11. FIG. 11 is a schematic perspective view showing the appearance of a resin mold type semiconductor laser device molded in a flat form in which part of the lead frame is exposed. With this flat type device, the volume of the resin material that covers and seals the surroundings of the end face destruction preventing layer 22 (FIG. 7) is made small, and the thickness of the resin layer of the sealing resin member around the LD element is uniformed. Thus, the amount of displacement due to thermal deformation of the resin is reduced, whereby the peeling phenomenon is suppressed. Samples were trial manufactured in which the end face destruction preventing layer 22 comprised a rubbery organosilicon resin consisting essentially of dimethylsiloxane, and the resin mold was a cylindrical resin mold as shown in FIG. 5 (Sample No. 1) or a thin flat resin mold with a partially exposed lead frame as shown in FIG. 11 (Sample No. 2). A heat cycle test of these samples was conducted, and the electrical and optical characteristics of the element were investigated in certain cycles. The conditions for the heat cycle test involved cycles each comprising heating the sample at 85° C. for 30 minutes, cooling it at −40° C. for 30 minutes, and then returning the sample to an endothermic reaction at 85° C.

TABLE 1

| Sample No. | Shape of resin mold | Details of defect | No. of heat cycles | | | |
|---|---|---|---|---|---|---|
| | | | 100 | 200 | 300 | 400 |
| 1 | Cylindrical | Defect in FFP (%) | 0 | 5 | 8 | 12 |
| | | Defect in other than FFP (%) | 0 | 0 | 0 | 0 |
| 2 | Flat (Lead frame exposed) | Defect in FFP (%) | 0 | 0 | 0 | 0 |
| | | Defect in other than FFP (%) | 0 | 0 | 0 | 0 |

As noted from Table 1, the cylindrical sample (No. 1) exhibited defects in FFP during the test, whereas the thin flat sample (No. 2) involved few defects. These defects in FFP are ascribed to the peeling of the interface between the end face destruction preventing layer 22 and the sealing resin member 11. Thus, peeling of the resin can be prevented by forming the sealing resin member 11 into a thin flat resin type.

However, the semiconductor laser device having the thin flat type sealing resin member formed with part of the lead frame exposed as shown in FIG. 11 poses the following problem:

The semiconductor laser device having a cylindrical sealing resin member is provided with a circular collar portion, and thus can be mounted on an instrument by being fitted into an accommodating hole, as can the can type device. The thin flat type sealing resin member, on the other hand, has no circular collar portion, and so cannot be mounted into an accommodating hole, unlike the conventional type.

SUMMARY OF THE INVENTION

In the light of the above-described problem, the subject for the present invention is to provide a resin mold type semiconductor laser device mountable on an instrument, like the conventional can type device, on condition that the point of light emission will not move or the peeling of resin will not occur.

To realize this subject, the first means devised by the present invention is a semiconductor laser device comprising a laser diode chip fixed on a broad portion of a lead frame via a submount layer, a sealing resin member having the laser diode chip molded with a transparent resin, and a pair of exposed parts extending on both sides of the lead frame and projecting outwards from the sealing resin member, wherein the exposed parts each have an arcuate segment inscribed in a hypothetical circle with its center at the point of light emission on the laser diode chip. The second means of the present invention is a semiconductor laser device in which an annular mounting aid inscribed in the hypothetical circle with its center at the point of light emission on the laser diode chip is secured to the exposed parts. This annular mounting aid may be in the form of a closed loop or an open loop.

According to the first means, the exposed parts for fixing purposes each have an arcuate segment. Thus, similar to the can type semiconductor laser device, the device can be mounted and fixed on an instrument by fitting the arcuate segments into an accommodating hole of the instrument. Moreover, when the arcuate segments are positioned, the point of light emission on the chip is automatically fixed, thus liberating the device from the problems of a shift in the point of light emission and the peeling of resin. Moreover, the arcuate segments have some elasticity (spring properties) and make pressure contact with the inner surface of the accommodating hole. Thus, the mounting of the device in the instrument can be facilitated.

According to the second means, the annular mounting aid is secured to the exposed parts. Thus, the same action as by the first means is exhibited. Particularly when an open loop-shaped annular mounting aid is used, elasticity (spring properties) can be imparted to the aid itself, thereby making the mounting of the device easier.

The above and other objects, effects, features and advantages of the present invention will become more apparent from the following description of embodiments thereof taken in conjunction with the accompanying drawings.

BRIEF DESCRIPTION OF THE DRAWINGS

FIG. 18 is a longitudinal sectional view showing a state in which the semiconductor laser device of Embodiment 1 is mounted on a cylindrical laser guide for an optical pickup for CDs;

FIG. 19 is a side view showing a state in which the semiconductor laser device of Embodiment 1 is mounted on a cylindrical laser guide for an optical pickup for CDs;

FIG. 20 is a longitudinal sectional view showing a state in which the semiconductor laser device of Embodiment 2 is mounted on a cylindrical laser guide for an optical pickup for CDs;

FIG. 21 is a side view showing a state in which the semiconductor laser device of Embodiment 2 is mounted on a cylindrical laser guide for an optical pickup for CDs;

FIG. 22 is a longitudinal sectional view showing a state in which a conventional can type semiconductor laser device is mounted on a cylindrical laser guide for an optical pickup for CDs; and FIG. 23 is a side view showing a state in which a conventional can type semiconductor laser device is mounted on a cylindrical laser guide for an optical pickup for CDs.

DETAILED DESCRIPTION OF PREFERRED EMBODIMENTS

Embodiment 1

Figure 1:
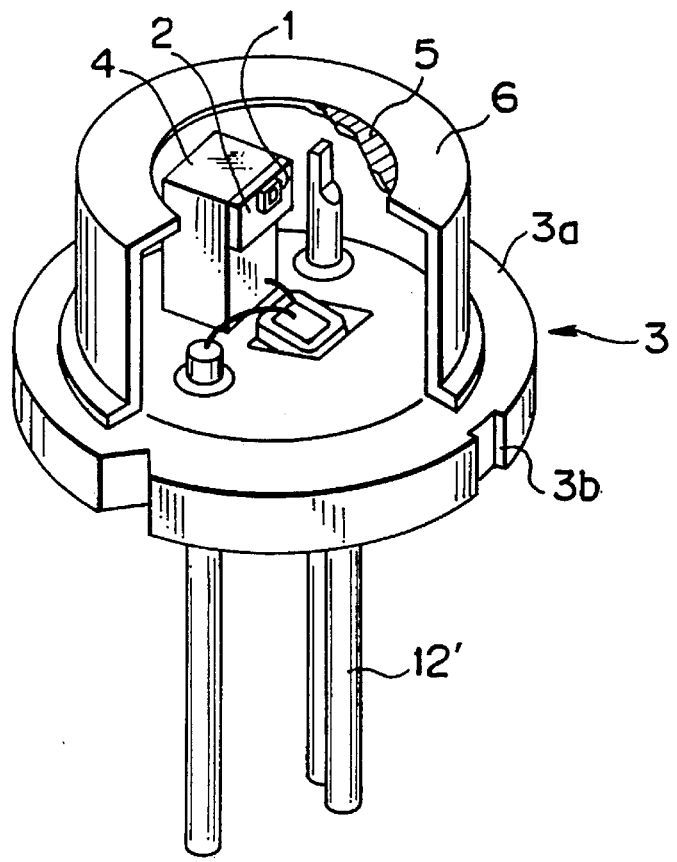
FIG. 1 is a partially cutaway perspective view showing a conventional can type semiconductor laser device.
Figure 2:
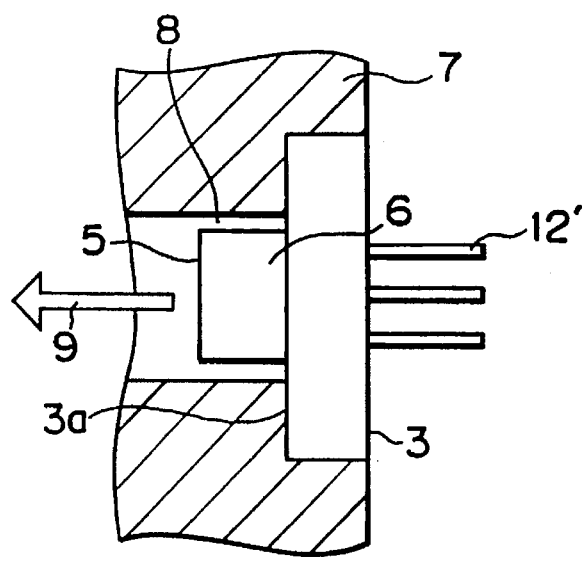
FIG. 2 is a view, partially in sections, showing the can type semiconductor laser device of FIG. 1 mounted on an optical instrument.
Figure 3:
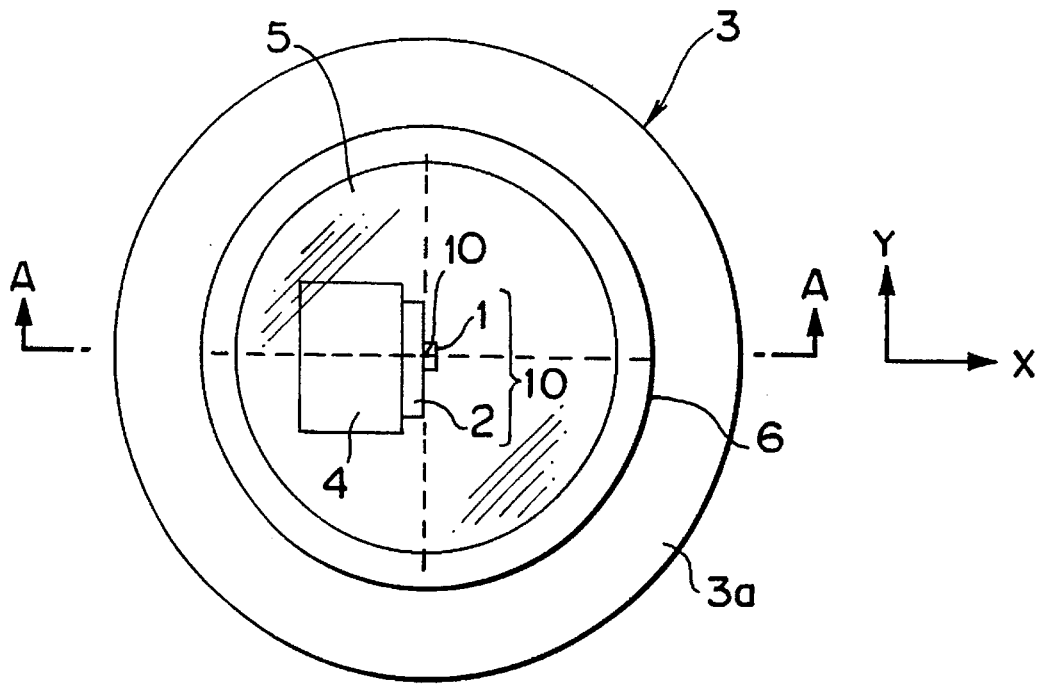
FIG. 3 is a plan view showing the can type semiconductor laser device of FIG. 1.
Figure 4:
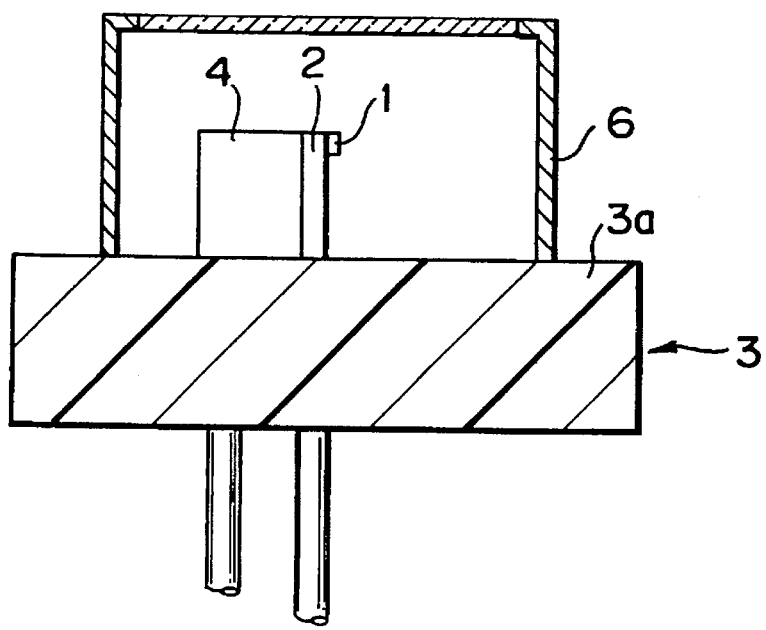
FIG. 4 is a sectional view taken on line A—A of FIG. 3.
Figure 5:
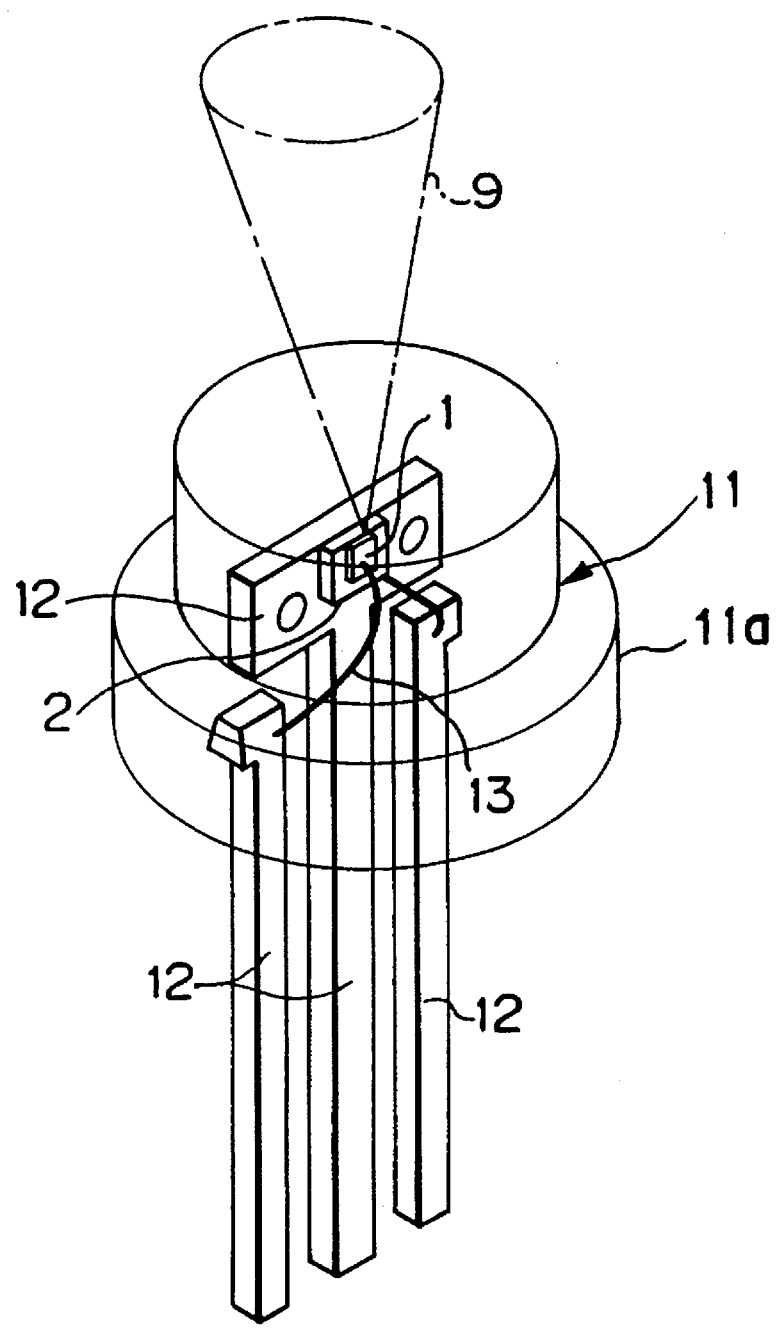
FIG. 5 is a perspective view showing a conventional resin mold type semiconductor laser device.
Figure 6:
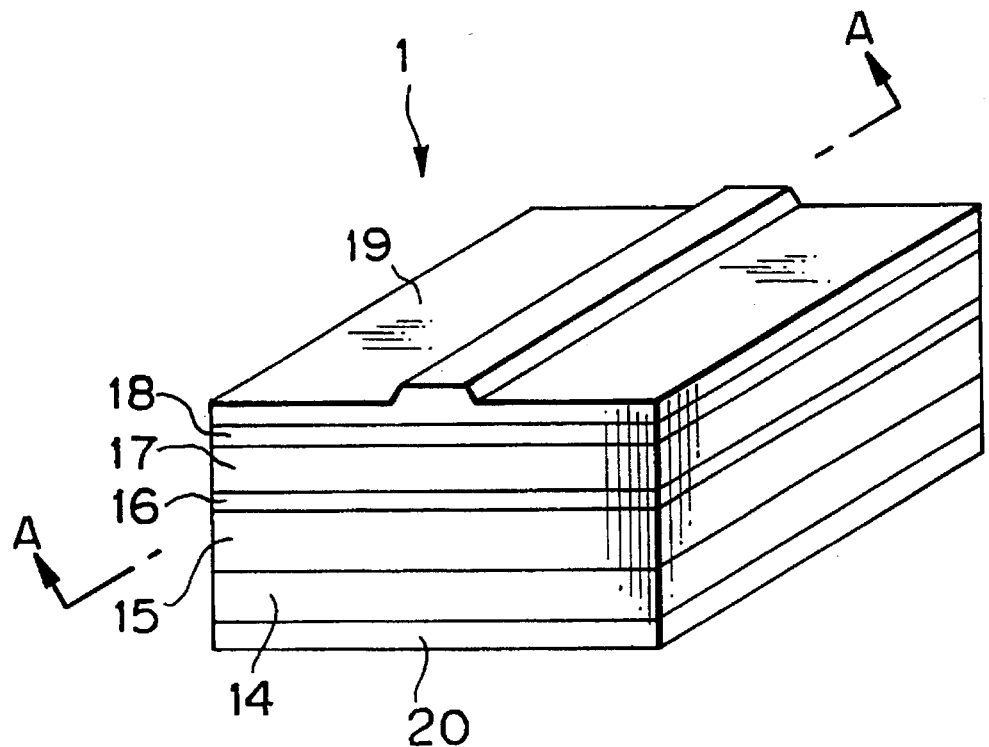
FIG. 6 is schematic sectional view showing the structure of an LD chip used in a conventional resin mold type semiconductor laser.
Figure 7:
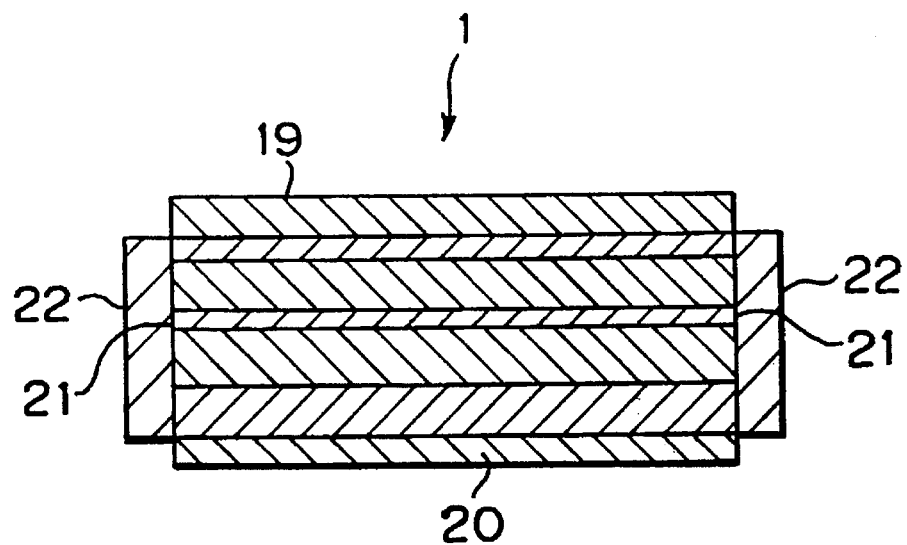
FIG. 7 is a sectional view taken on line A—A of FIG. 6.
Figure 8:
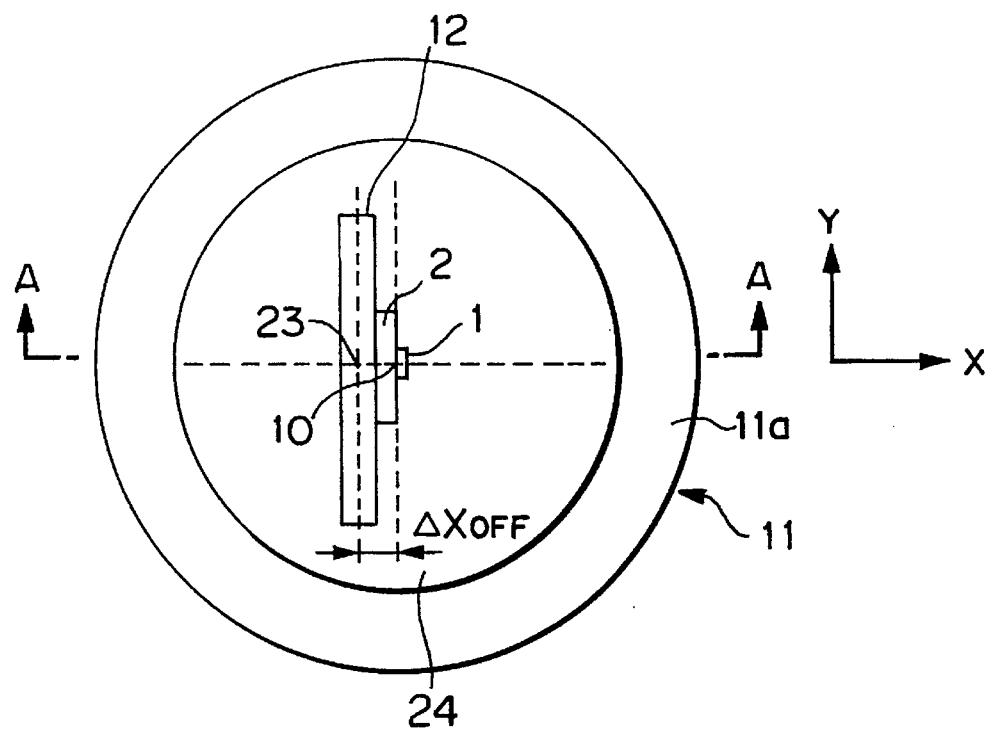
FIG. 8 is a plan view of the resin mold type semiconductor laser device shown in FIG. 5.
Figure 9:
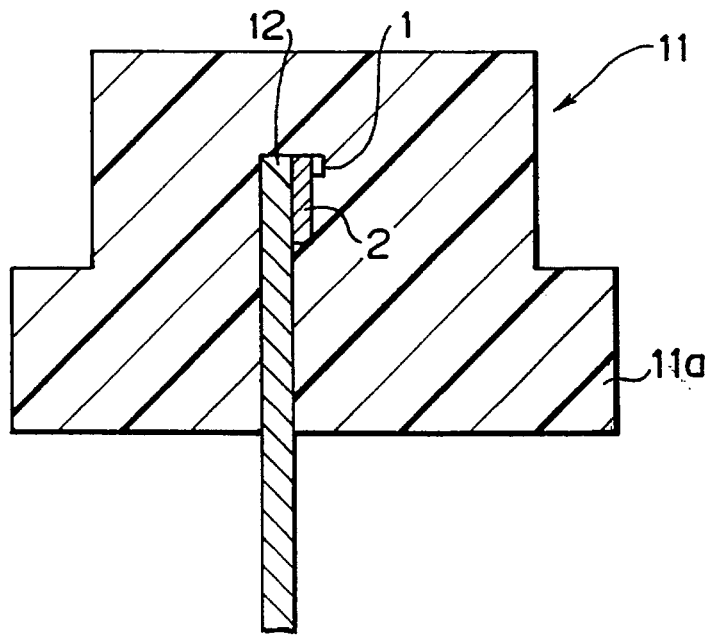
FIG. 9 is a sectional view taken on line A—A of FIG. 8.
Figure 10:
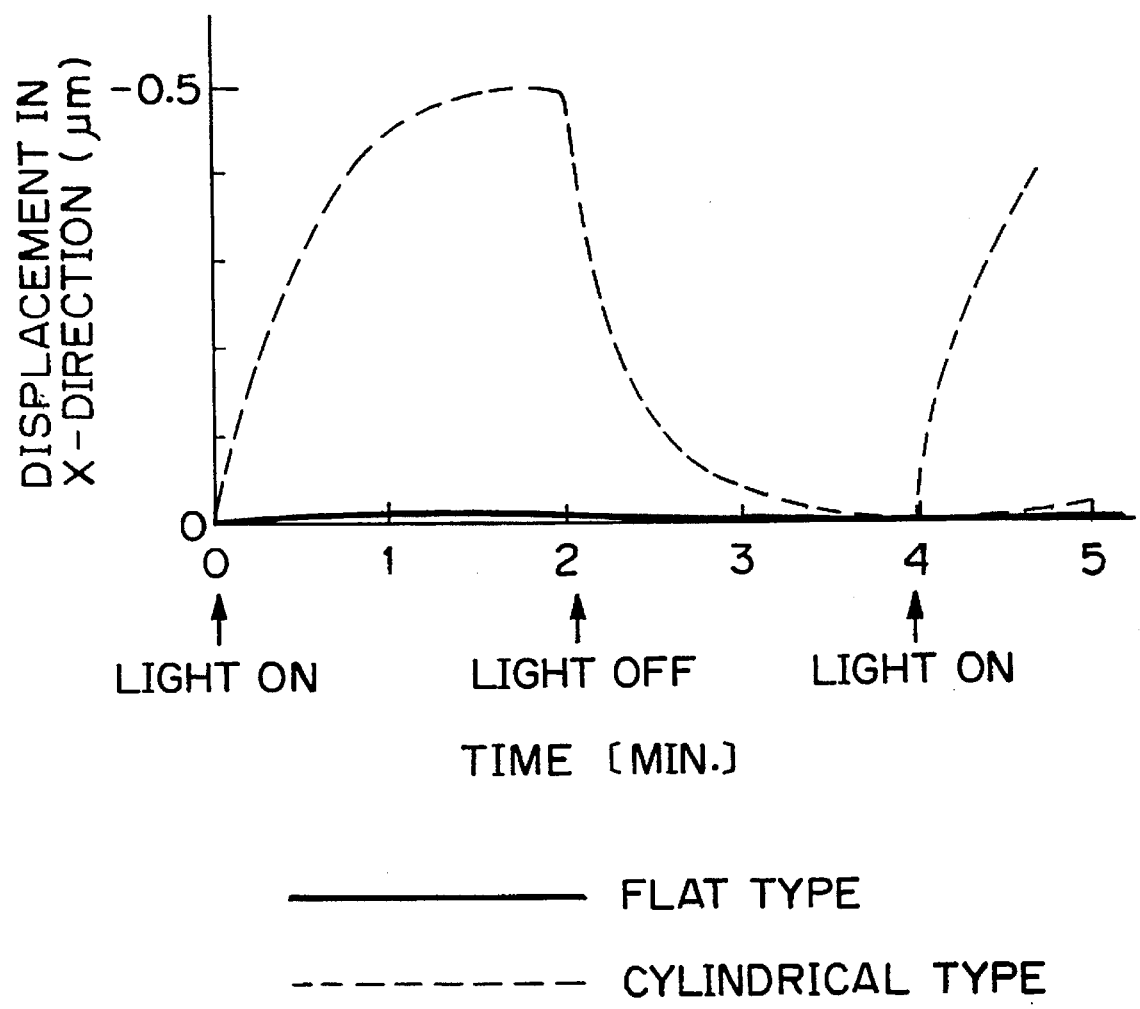
FIG. 10 is a graph illustrating the relationship between the amount of the displacement of the point of light emission in the X-direction shown in FIG. 8 and the time that elapses until the action of turning the light on or off.
Figure 11:
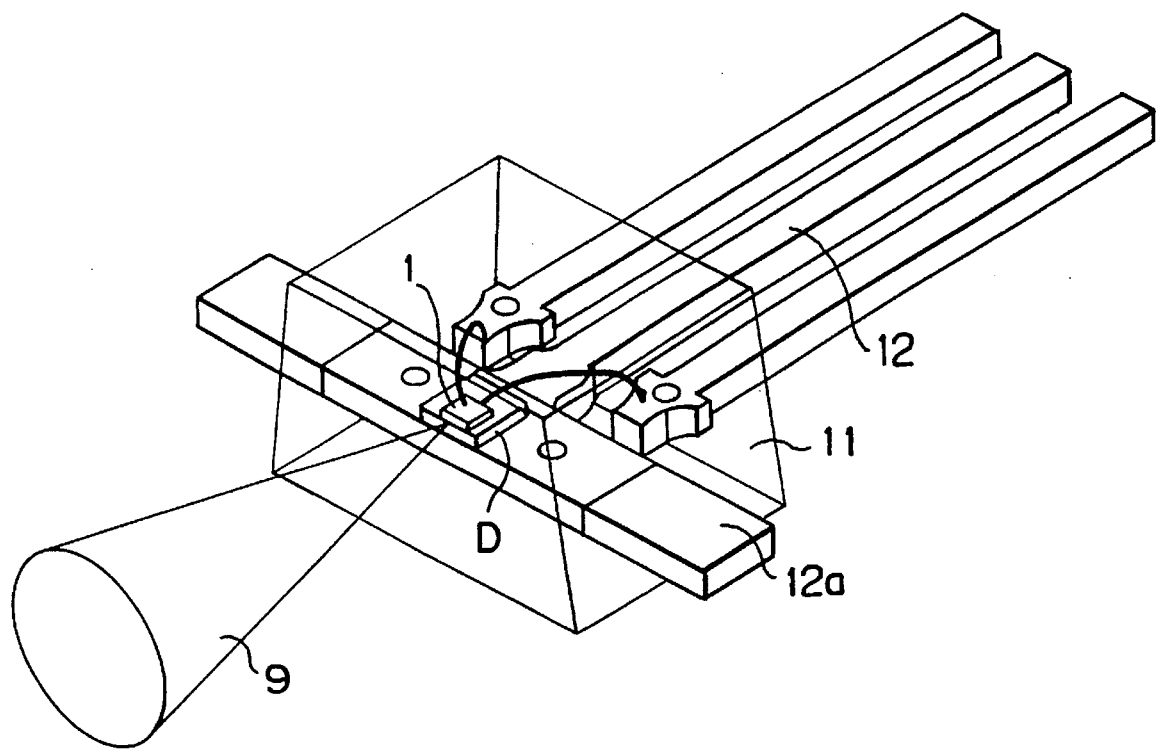
FIG. 11 is a perspective view showing a flat resin mold type semiconductor laser device.
Figure 12:
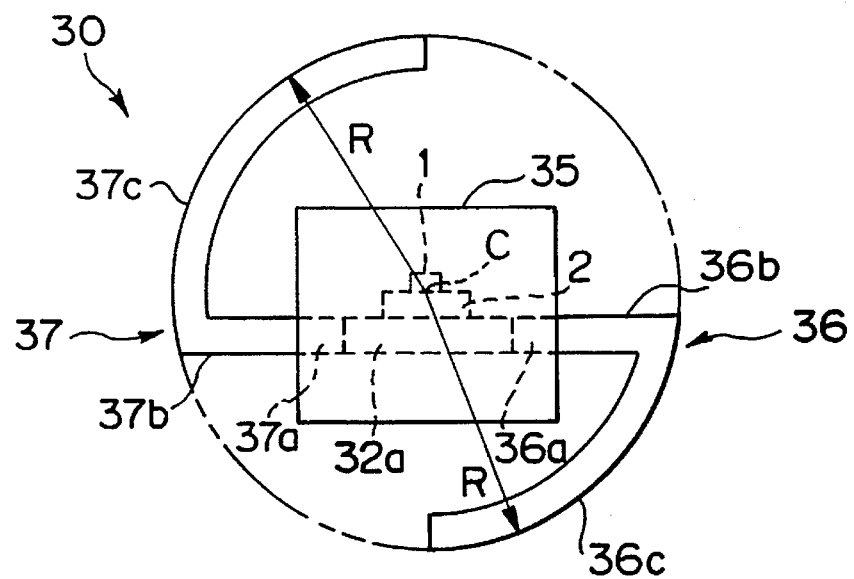
FIG. 12 is a plan view showing a resin mold type semiconductor laser device relevant to Embodiment 1 of the present invention.
Figure 13:
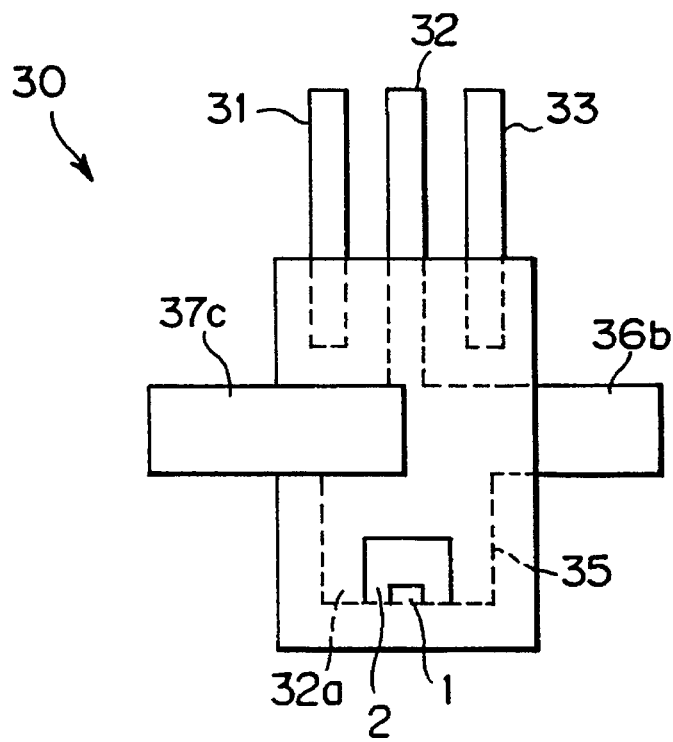
FIG. 13 is a front view showing the semiconductor laser device of Embodiment 1.
Figure 14:
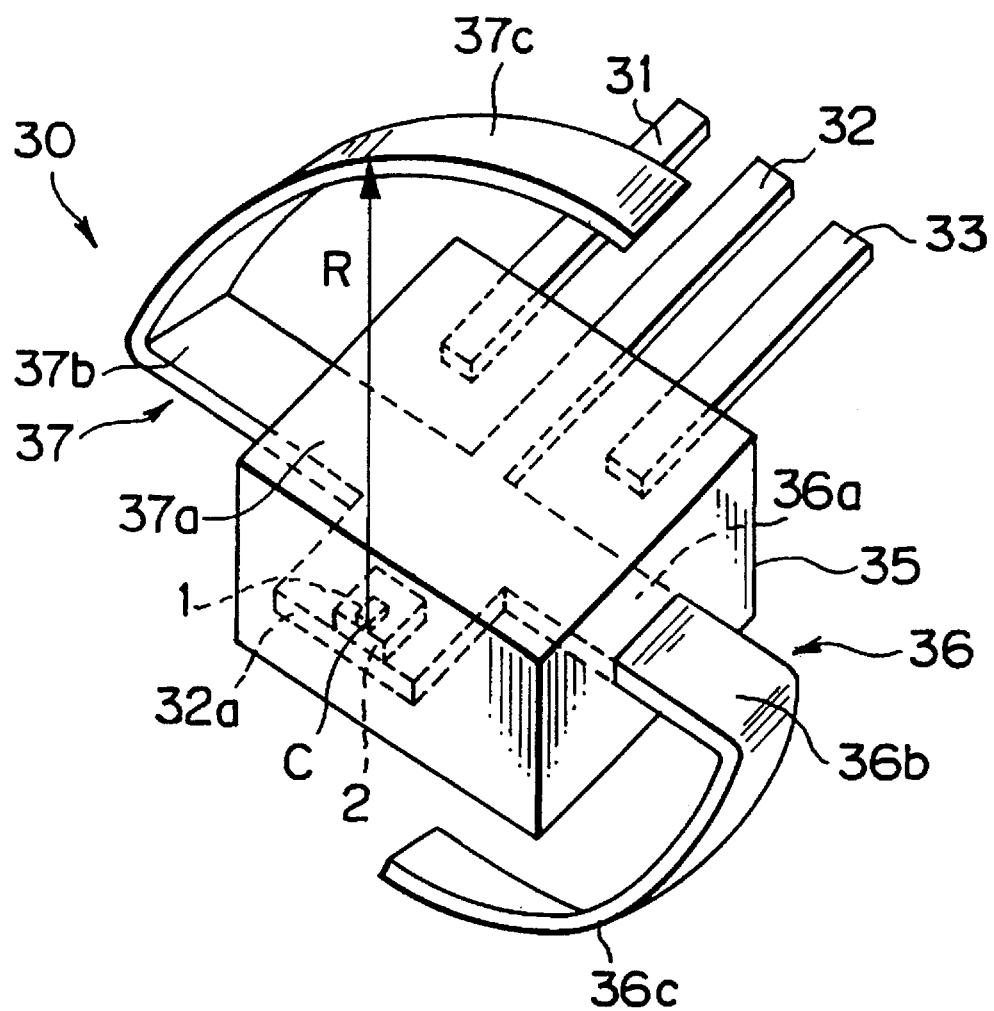
FIG. 14 is a perspective view showing the semiconductor laser device of Embodiment 1.

FIG. 12 is a plan view showing a resin mold type semiconductor laser device relevant to Embodiment 1 of the present invention, FIG. 13 is a front view of the device, and FIG. 14 is a perspective view of the device. A resin mold type semiconductor laser device 30 according to this embodiment comprises lead frames 31, 32, 33, an LD chip 1 secured onto a broad end portion 32a of the lead frame 32 via a submount layer 2 and having an end face destruction preventing layer (not shown), and a flat type sealing resin member 35 for molding the surroundings of the front end portions of the lead frames 31, 32, 33 with a transparent epoxy resin or the like. The lead frame 32 has projecting portions 36, 37 projecting in a right-and-left direction, like arms, from the sides of the broad end portion 32a. The projecting piece portions 36, 37 comprise mold region parts 36a, 37a that are molded within the flat type sealing resin member 35, and exposed parts 36b, 37b exposed to the outside from the sealing resin member 35. One of the exposed parts, 36b, has an arcuate segment 36c that is bent such that its external surface extends clockwise in FIG. 12 along a hypothetical circle drawn with radius R about the point of light emission, C, on the LD chip 1. In the instant embodiment, the angle covered by the arcuate segment 36c is about 90° C. The other exposed part 37b has an arcuate segment 37c bent such that its external surface extends clockwise in FIG. 12 along the hypothetical circle drawn with the radius R about the point of light emission, C, on the LD chip 1. In the instant embodiment, the angle covered by the arcuate segment 37c is about 90° C.

As noted above, the exposed parts 36b, 37b serve as fixing pieces an are not straight throughout, but have the arcuate segments 36c, 37c which conform to arcs of a circle drawn with radius R about the point C of light emission. In FIGS. 12, 13 and 14, no gold wires are shown.

Such a resin mold type semiconductor laser device having the arcuate segments 36c, 37c inscribed in the hypothetical circle can be fitted into a stepped accommodating hole of an instrument and set in place there, like the mounting (packaging) of a can type semiconductor laser device. Simultaneously, the fixation of the arcuate segments 36c, 37c means the fixation of the point of light emission, C, of the LD chip 1 on the broad end portion 32a of the lead frame 32. Thus, neither a shift in the point of light emission, C, nor the peeling of resin arises. Furthermore, the arcuate segments 36c, 37c have some elasticity (springiness), which presses them against the inner surface of a stepped accommodating hole when they are inserted there. Thus, the device can be mounted more easily. The radius R of the hypothetical circle with the point of light emission, C, as the center may be determined based on the size of the accommodating hole, but can also be conformed to the outside diameter of the collar portion of the stem of a can type device.

FIGS. 18 and 19 each show the semiconductor laser device 30 of the instant embodiment mounted on a cylindrical laser guide 28 for an optical pickup for CDs. The arcuate segments 36c, 37c are fitted into a stepped accommodating hole 8.

Embodiment 2

Figure 15:
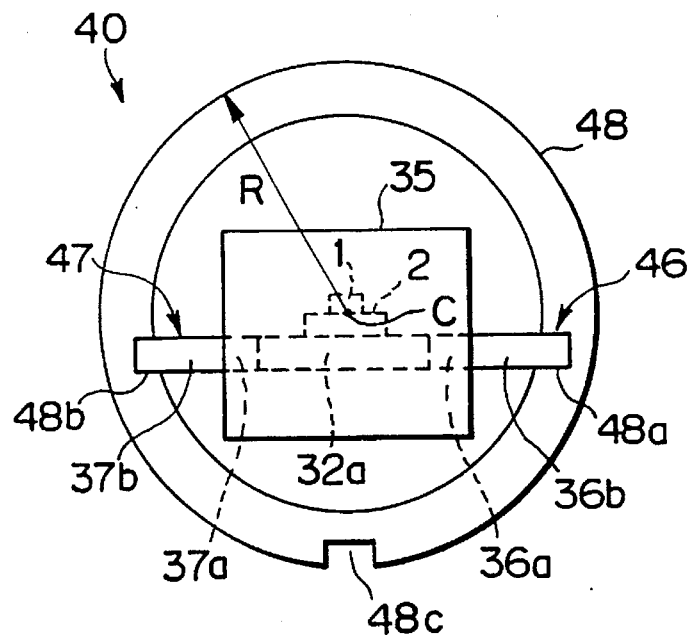
FIG. 15 is a plan view showing a resin mold type semiconductor laser device relevant to Embodiment 2 of the present invention.
Figure 16:
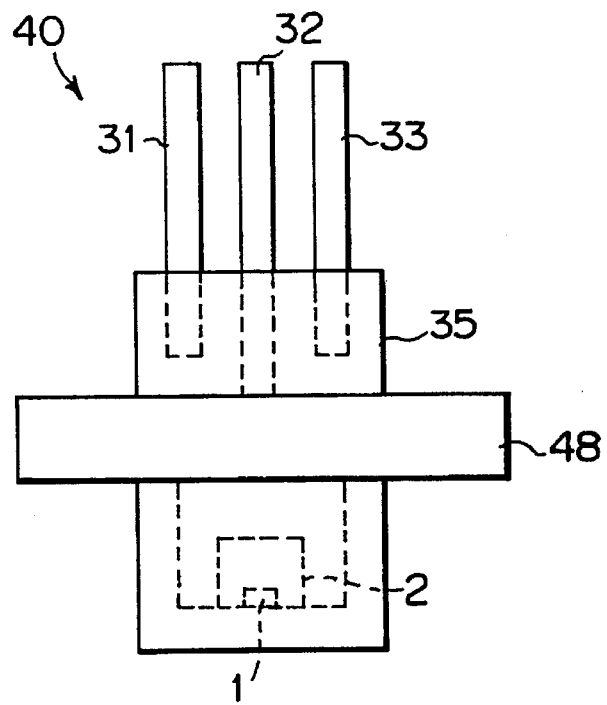
FIG. 16 is a front view showing the semiconductor laser device of Embodiment 2.
Figure 17:
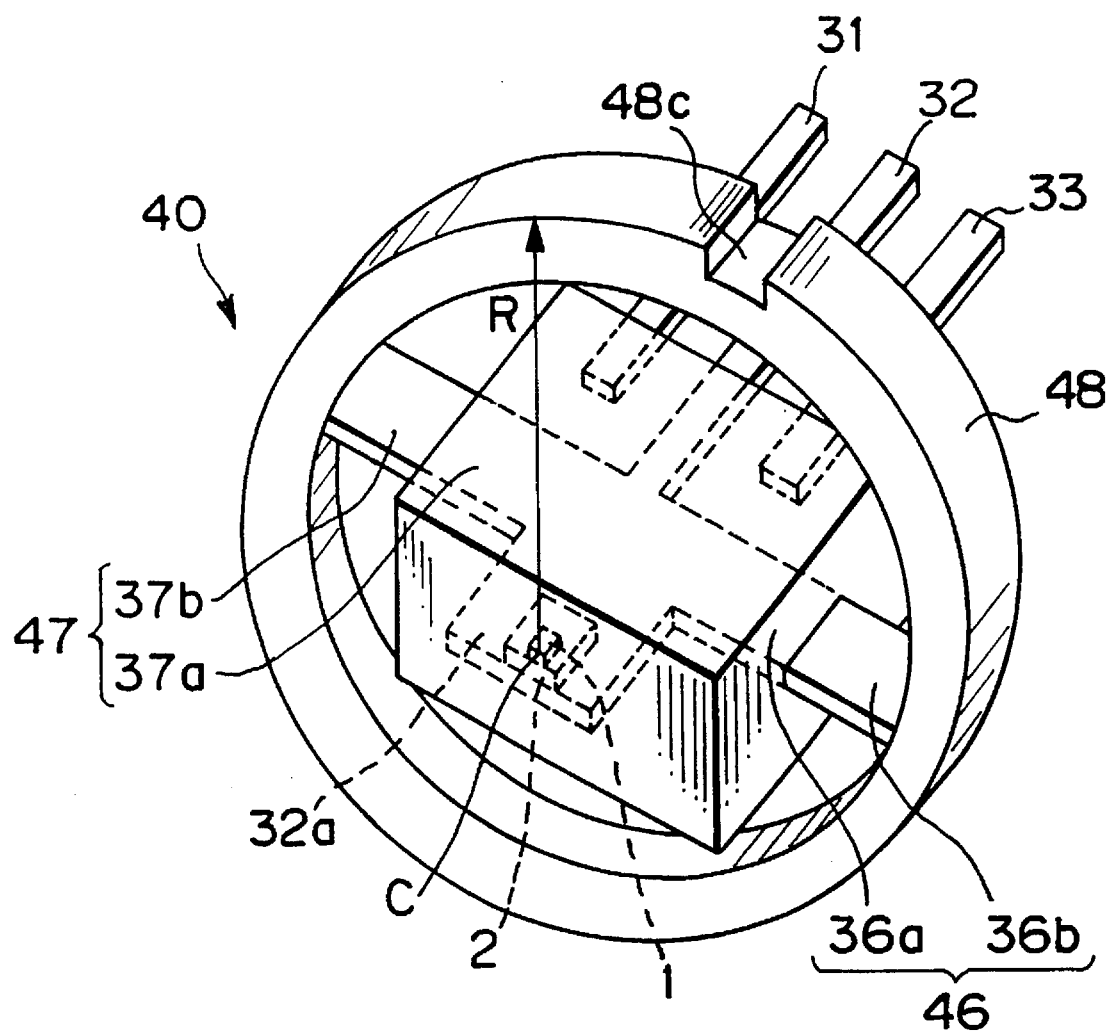
FIG. 17 is a perspective view showing the semiconductor laser device of Embodiment 2.

FIG. 15 is a plan view showing a resin mold type semiconductor laser device relevant to Embodiment 2 of the present invention, FIG. 16 is a front view of the device, and FIG. 17 is a perspective view of the device. A resin mold type semiconductor laser device 40 according to this embodiment, as with Embodiment 1, comprises lead frames 31, 32, 33, an LD chip 1 secured onto a broad end portion 32a of the lead frame 32 via a submount layer 2 and having an end face destruction preventing layer (not shown), and a flat type sealing resin member 35 for molding the surroundings of the front end portions of the lead frames 31, 32, 33 with a transparent epoxy resin or the like. The lead frame 32 has projecting portions 46, 47 projecting in a right-and-left direction, like arms, from the sides of the broad end portion 32a. The projecting portions 46, 47 comprise mold region parts 36a, 37a that are molded within the flat type sealing resin member 35, and exposed parts 36b, 37b that are exposed to the outside from the sealing resin member 35. The structure of the device described up to here is the same as that of a conventional flat resin mold type semiconductor laser device. In the instant embodiment, however, the front ends of the exposed parts 36b, 37b are fitted undetachably into mounting grooves 48a, 48b of an annular mounting aid (adapter) 48, and the outer peripheral surface of the annular mounting aid 48 is inscribed in a hypothetical circle drawn with the radius R about the point of light emission, C. The undetachable fitting between the mounting grooves 48a, 48b of the annular mounting aid 48 and the front ends of the exposed parts 36b, 37b is performed by using an adhesive or by caulking. In the outer peripheral surface of the annular mounting aid 48 is formed a register groove 48c for use at the time of packaging. The material for the annular mounting aid 48 is desirably one having the same coefficient of thermal expansion as that of the material for the lead frame. In FIGS. 15, 16 and 17, no gold wires are shown.

As described above, the annular mounting aid 48, a separate member from the lead frame 32, can be fitted into the stepped accommodating hole of the instrument, whereby the resin mold type semiconductor laser device 40 can be mounted, thus exhibiting the same effects as in Embodiment 1. Needless to say, an annular mounting aid 48 of an open loop shape may be used. The use of such an open loop type aid can impart elasticity (springiness) to the aid itself, thus facilitating the mounting of the device. The radius R of the hypothetical circle, as in Embodiment 1, may be determined based on the size of the accommodating hole, but can also be conformed to the outside diameter of the collar portion of the stem of a can type device.

FIGS. 20 and 21 each show the semiconductor laser device 40 of the instant embodiment mounted on a cylindrical laser guide 28 for an optical pickup for CDs. The annular mounting aid 48 is fitted into a stepped accommodating hole 8. FIGS. 22 and 23 each show a conventional can type semiconductor laser device mounted on a cylindrical laser guide 28 for an optical pickup for CDs.

As described thus far, the first means of the present invention is characterized in that the pair of exposed parts extending on both sides of the lead frame and projecting outwards from the sealing resin member do not end straight, but integrally have arcuate segments inscribed in a hypothetical circle having the point of light emission as its center. The second means of the present invention is characterized by securing the exposed parts to a separate annular mounting aid, inscribed in a hypothetical circle having the point of light emission as its center. Thus, the device of the present invention exhibits the following effects:

The exposed parts for fixing purposes have the arcuate segment or the annular mounting aid. Thus, similar to a can type semiconductor laser device, the device of the invention can be mounted and fixed on an instrument by fitting the arcuate segments or the annular mounting aid into an accommodating hole of the instrument. Moreover, upon positioning the arcuate segments or the annular mounting aid, the point of light emission on the chip is automatically fixed, thus liberating the device from the problems of a shift in the point of light emission and the peeling of resin.

The present invention has been described in detail with respect to preferred embodiments, and it will now be apparent that changes and modifications may be made without departing from the invention in its broader aspects, and it is the intention, therefore, in the appended claims to cover all such changes and modifications as fall within the true spirit of the invention.

What is claimed is:

1. A semiconductor laser device comprising:

a laser diode chip fixed on a broad portion of a lead frame via a submount layer;

a sealing resin member having the laser diode chip molded with a transparent resin;

a first exposed part extending from a first side of the lead frame and projecting outwards from the sealing resin member, the first exposed part having an arcuate segment inscribed in a hypothetical circle having the point of light emission on the laser diode chip as its center; and a second exposed part extending from a second side of the lead frame and projecting outwards from the sealing resin member, the second exposed part having another arcuate segment which is inscribed in the hypothetical circle.

2. The semiconductor laser device of claim 1, wherein the arcuate segments do not touch the sealing resin member.

3. A semiconductor laser device comprising:

a laser diode chip fixed on a broad portion of a lead frame via a submount layer;

a sealing resin member having the laser diode chip molded with a transparent resin;

a pair of exposed parts extending on both sides of the lead frame and projecting outwards from the sealing resin member; and an annular mounting aid secured to the exposed parts, the annular mounting aid being inscribed in a hypothetical circle having the point of light emission on the laser diode chip as its center.

4. The semiconductor laser device as claimed in claim 3 wherein the annular mounting aid is in the form of an open loop.

5. The semiconductor laser device of claim 3, wherein the annular mounting aid does not touch the sealing resin member.

6. A semiconductor light-emitting device which is configured to be mounted on a member having a hole with a cylindrical wall, comprising:

a lead frame having a broad portion, a first projecting portion which extends from a first side of the broad portion, and a second projecting portion which extends from a second side of the broad portion;

a semiconductor light-emitting element;

means for mounting the light-emitting element on the broad portion of the lead frame; and a resin member which encloses the broad portion of the lead frame, the light-emitting element, the means for mounting, part of the first projecting portion of the lead frame, and part of the second projecting portion of the lead frame, the sealing resin member leaving another part of the first projecting portion and another part of the second projecting portion exposed, wherein the exposed part of the first projecting portion and the exposed part of the second projecting portion have first and second bent segments, respectively, the first bent segment being shaped to contact the cylindrical wall of the hole at a plurality of spaced-apart locations on the cylindrical wall and the second bent segment also being shaped to contact the cylindrical wall at a plurality of spaced-apart locations on the cylindrical wall.

7. The semiconductor light-emitting device of claim 6, wherein the lead frame is a unitary element, with the first and second projecting portions being integrally connected to the broad portion.

8. The semiconductor light-emitting device of claim 6, wherein the light-emitting element comprises a laser diode chip.

9. The semiconductor light-emitting device of claim 6, wherein neither the first bent segment nor the second bent segment touches the resin member.

10. The semiconductor light-emitting device for claim 6, wherein the first bent segment has an arcuate shape.

11. The semiconductor light-emitting device of claim 10, wherein the first bent segment has a length that is approximately equal to a fourth of the circumference of the cylindrical wall.

12. The semiconductor light-emitting device of claim 10, wherein the second bent segment has an arcuate shape.

13. The semiconductor light-emitting device of claim 12, wherein the first bent segment has a length that is approximately equal to a fourth of the circumference of the cylindrical wall and the second bent segment also has a length that is approximately equal to a fourth of the circumference of the cylindrical wall.

14. The semiconductor light-emitting device of claim 13, wherein the first bent segment extends in one of a clockwise and a counterclockwise direction and the second bent segment also extends in said one of a clockwise and a counterclockwise direction.

15. The semiconductor light-emitting device of claim 12, wherein the first bent segment extends in one of a clockwise and a counterclockwise direction and the second bent segment also extends in said one of a clockwise and a counterclockwise direction.

16. The semiconductor light-emitting element of claim 15, wherein the first bent segment has a length that is approximately equal to the length of the second bent segment.

17. A semiconductor light-emitting device, comprising:

a lead frame having a broad portion, a first projecting portion which extends from a first side of the broad portion, and a second projecting portion which extends from a second side of the broad portion;

a semiconductor light-emitting element;

means for mounting the light-emitting element on the broad portion of the lead frame;

a resin member which encloses the broad portion of the lead frame, the light-emitting element, the means for mounting, part of the first projecting portion of the lead frame, and part of the second projecting portion of the lead frame, the sealing resin member leaving another part of the first projecting portion and another part of the second projecting portion exposed, the exposed parts of the first and second projecting portions extending outwardly from the resin member and having outer ends that are spaced apart from the resin member; and a mounting aid to which the outer ends of the exposed parts of the first and second projecting portions are attached, the mounting aid being spaced apart from the resin member.

18. The semiconductor light-emitting device of claim 17, wherein the broad portion of the lead frame and the first and second projecting portions lie in a plane.

19. The semiconductor light-emitting device of claim 17, wherein the mounting aid comprises an annular member having a central axis, and wherein the semiconductor light-emitting element is mounted at a location which lies along the central axis of the annular member.

20. The semiconductor light-emitting device of claim 17, wherein the light-emitting element comprises a laser diode chip.

* * * * *